United States Patent
Storage et al.

(10) Patent No.: US 10,690,422 B2
(45) Date of Patent: Jun. 23, 2020

(54) THERMAL MANAGEMENT SYSTEM

(71) Applicants: General Electric Company, Schenectady, NY (US); Unison Industries, LLC, Jacksonville, FL (US)

(72) Inventors: Michael Ralph Storage, Beavercreek, OH (US); Scott Richard Lawrence, Cincinnati, OH (US); Ronald Eugene Bruskotter, Oxford, OH (US); Walter Arthur Hundley, Jr., Beavercreek, OH (US); Dennis Alan McQueen, Miamisburg, OH (US); Ronald Bruce Schofield, Clarksville, OH (US)

(73) Assignees: General Electric Company, Schenectady, NY (US); Unison Industries, LLC, Jacksonville, FL (US)

( * ) Notice: Subject to any disclaimer, the term of this patent is extended or adjusted under 35 U.S.C. 154(b) by 0 days.

(21) Appl. No.: 16/528,966

(22) Filed: Aug. 1, 2019

(65) Prior Publication Data

US 2020/0041219 A1 Feb. 6, 2020

Related U.S. Application Data

(60) Provisional application No. 62/714,111, filed on Aug. 3, 2018.

(51) Int. Cl.
*F28F 9/26* (2006.01)
*F28F 3/12* (2006.01)
*F28F 27/02* (2006.01)
*G01L 19/14* (2006.01)

(52) U.S. Cl.
CPC ............ *F28F 9/26* (2013.01); *F28F 3/12* (2013.01); *F28F 27/02* (2013.01); *G01L 19/14* (2013.01)

(58) Field of Classification Search
CPC ............ F28F 9/26; F28F 27/02; F28F 3/12
USPC ............................................................ 73/431
See application file for complete search history.

(56) References Cited

U.S. PATENT DOCUMENTS

| | | | |
|---|---|---|---|
| 6,529,394 B1 | 3/2003 | Joseph et al. | |
| 7,220,365 B2 | 5/2007 | Qu et al. | |
| 8,052,383 B2 | 11/2011 | Frokjaer | |
| 8,177,521 B2 | 5/2012 | Chen et al. | |
| 8,424,285 B2 | 4/2013 | Veilleux, Jr. | |
| 8,919,481 B2 | 12/2014 | Matsuda | |
| 9,204,566 B2 | 12/2015 | Balk et al. | |
| 2018/0051946 A1* | 2/2018 | Stambaugh, Sr. | F28D 15/00 |
| 2018/0187601 A1 | 7/2018 | Segura Martinez Ade Ilarduya et al. | |
| 2019/0310034 A1* | 10/2019 | Kobayashi | H01J 37/3497 |

* cited by examiner

*Primary Examiner* — Jamel E Williams
(74) *Attorney, Agent, or Firm* — McGarry Bair PC

(57) ABSTRACT

A method and assembly for conveying heat from a heat exchanger having a housing defining a fluid pathway including at least one fluid passageway leading from an inlet port of the heat exchanger to an outlet port of the heat exchanger, the housing have a first side and a second side, opposite the first side where the housing includes at least one aperture extending through the housing from the first side to the second side and where the aperture is fluidly separate from the fluid pathway and heat from liquid flowing through the fluid pathway is transferred via at least one of conduction or convection to the housing.

20 Claims, 17 Drawing Sheets

THERMAL MANAGEMENT SYSTEM

CROSS-REFERENCE TO RELATED APPLICATION(S)

This application claims the benefit of U.S. Provisional Patent Application No. 62/714,111, filed Aug. 3, 2018, which is incorporated herein by reference in its entirety.

BACKGROUND

Aircraft engines require highly reliable systems for control to ensure safe and efficient operation. Reliable control for more sophisticated gas turbine engines, and even some piston engines, is maintained, for example, by a Full Authority Digital Engine Control (FADEC), which controls engine operation. A FADEC receives cockpit commands in the form of a signal indicative of a performance level required from an engine. The FADEC also receives signals from a variety of sensors and other systems around the engine and the aircraft. The FADEC applies a set of control rules to the received signals and determines control signals to send to effectors on and around the engine. The control signals sent by the FADEC direct the effectors in such a way as to produce the required engine performance level. The FADEC performs this control function many times per second.

BRIEF DESCRIPTION

An aspect of the disclosure relates to an avionics control assembly, comprising an engine control device having a housing defining an exterior and an interior with at least one connector extending from the exterior of the housing and a heat exchanger having a heat exchanger housing defining a fluid pathway including at least one fluid passageway leading from an inlet port of the heat exchanger to an outlet port of the heat exchanger, the housing having a first side and a second side, opposite the first side where the heat exchanger housing includes at least one aperture extending through the heat exchanger housing from the first side to the second side and where the aperture is fluidly separate from the fluid pathway, where the heat exchanger is operably coupled to the exterior of the housing with the at least one connector located within the aperture and heat from liquid flowing through the fluid pathway is transferred via at least one of conduction or convection to the housing.

Another aspect of the disclosure relates to a method of controlling temperature in an electronics device, the method comprising flowing heat exchange fluid from a portion of a turbine engine to a heat exchanger that is operably coupled to an electronics device located within the nacelle of the turbine engine, and conveying heat from the flowing heat exchange fluid to an interior of the electronics device to at least one of increase a temperature of the electronics device, thaw frozen ice in the electronics device, prevent freezing of water in the electronics device, or evaporate water in the electronics device.

DETAILED DESCRIPTION

Figure 1:
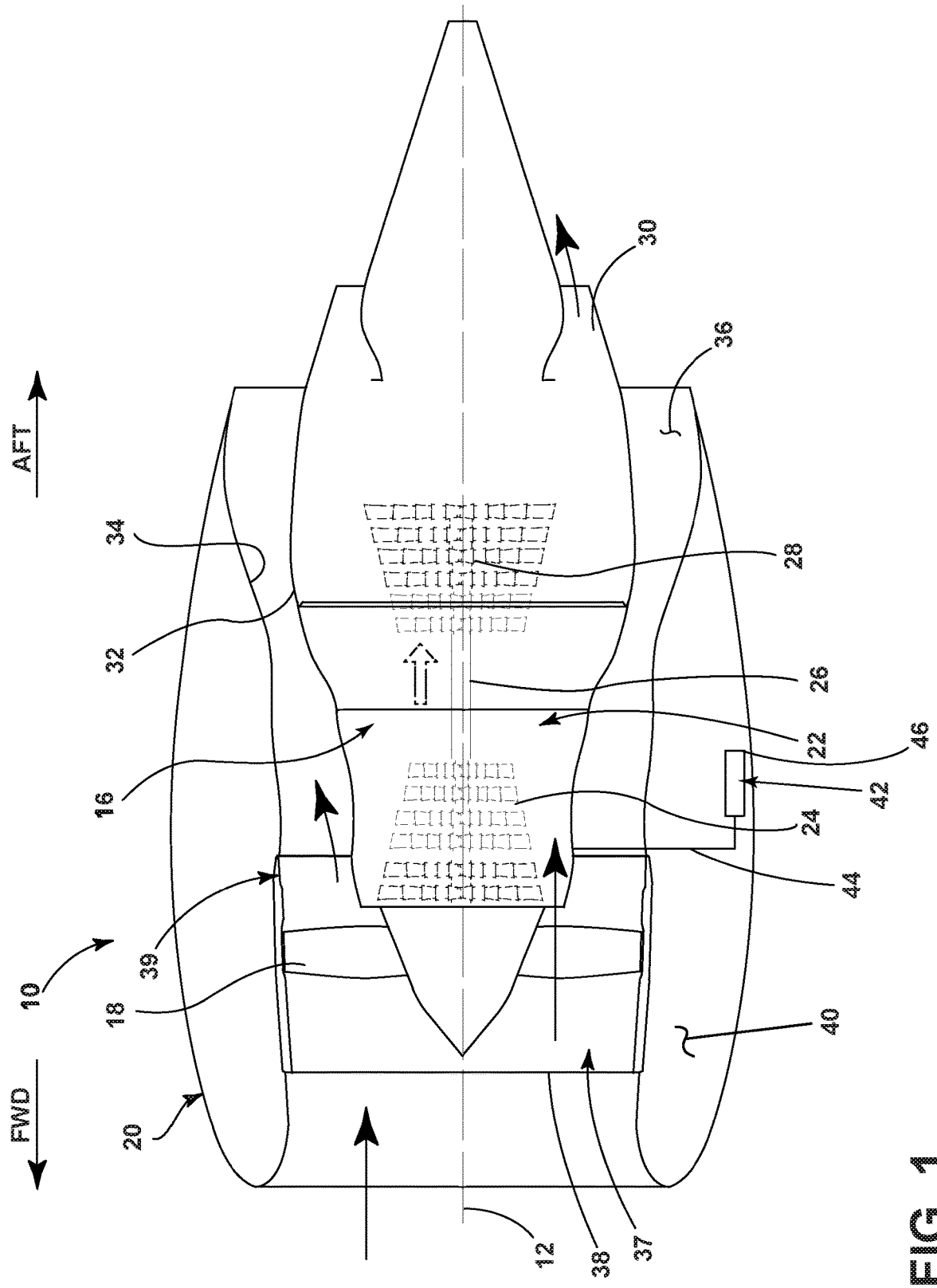
FIG. 1 is a schematic, partially cut away view of a turbine engine assembly with a Pressure Subsystem (PSS) located therein.

Aspects disclosed herein relate to a heat exchanger for engine control devices such as the FADEC or PSS, which can be included in or separate from the FADEC. Both the FADEC and PSS have been historically mounted on the engine case to minimize the routing length of the sensor and actuator wiring. The FADEC and other known components such as the PSS can develop problems in service as evaporated water in the components condenses, accumulates, and then freezes. The evaporated and condensed water does not pose as much of an issue during operation if any as compared to the frozen water. In the case of the PSS, which includes diaphragms that measure pressure differences in air from the compressors of the engine, the air can be blocked, the diaphragm can be damaged, or the sensor output can be partially fouled by the frozen water. Aspects of the present disclosure utilize a heat exchanger to provide convective and conductive heat to eliminate frozen water in such engine control devices.

The heat exchanger for engine control devices is described herein in the environment of a turbine engine; particularly, a heat exchanger for a FADEC or PSS unit. It will be understood, however, that aspects of the disclosure described herein are not so limited and may have general applicability within any avionics elements or systems, as well as in non-aircraft applications, such as other mobile applications and non-mobile industrial, commercial, and residential applications.

As used herein, the term "upstream" refers to a direction that is opposite the fluid flow direction, and the term "downstream" refers to a direction that is in the same direction as the fluid flow. The term "fore" or "forward"

means in front of something and "aft" or "rearward" means behind something. For example, when used in terms of fluid flow, fore/forward means upstream and aft/rearward means downstream. Additionally, as used herein, the terms "radial" or "radially" refer to a direction away from a common center. For example, in the overall context of a turbine engine, radial refers to a direction along a ray extending between a center longitudinal axis of the engine and an outer engine circumference. Furthermore, as used herein, the term "set" or a "set" of elements can be any number of elements, including only one.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are only used for identification purposes to aid the reader's understanding of the present disclosure, and do not create limitations, particularly as to the position, orientation, or use of aspects of the disclosure described herein. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to one another. The exemplary drawings are for purposes of illustration only and the dimensions, positions, order, and relative sizes reflected in the drawings attached hereto can vary.

Referring to FIG. 1, a turbine engine assembly 10 defines a longitudinal engine centerline 12 extending from forward to aft. A turbine engine 16, a fan assembly 18, and a nacelle 20 can be included in the turbine engine assembly 10, with portion of the nacelle 20 cut away for clarity. The turbine engine 16 can include an engine core 22 having a compressor section 24, a combustion section 26, a turbine section 28, and an exhaust section 30. An inner cowl 32 radially surrounds the engine core 22. The nacelle 20 surrounds the turbine engine 16 including the inner cowl 32 and the core engine 22. In this manner, the nacelle 20 forms an outer cowl 34 radially surrounding the inner cowl 32. The outer cowl 34 is spaced from the inner cowl 32 to form an annular passage 36 between the inner cowl 32 and the outer cowl 34. The annular passage 36 characterizes, forms, or otherwise defines a nozzle and a generally forward-to-aft bypass airflow path. A fan casing assembly 37 having an annular forward casing 38 and an aft casing 39 can form a portion of the outer cowl 34 formed by the nacelle 20 or can be suspended from portions of the nacelle 20 via struts (not shown) or other suitable mounting structures.

The outer cowl 34 can include a hollow compartment 40 that houses one or more mechanical or electronic components therein. For example, an engine control assembly 42 is coupled, either by wired or wirelessly connectivity, in communication with one or more subsystems or components of turbine engine assembly 10 to control the operation of turbine engine assembly 10. It will be understood that the engine control assembly 42 can be any suitable system for controlling one or more subsystems or components of turbine engine assembly 10. By way of non-limiting example, the engine control assembly 42 can include a FADEC system 46. The connection with the engine is schematically illustrated by connection 44 and can further represent any fluid communication necessary such as compressed air from the compressor section 24 to a PSS 50 (FIG. 2), which can be incorporated into the FADEC system 46 or can form a separate engine control assembly 42. Further still, the connection 44 can represent a fluid communication such as engine oil to and from a heat exchanger 52 (FIG. 2) that can be included in the engine control assembly 42.

Figure 2:
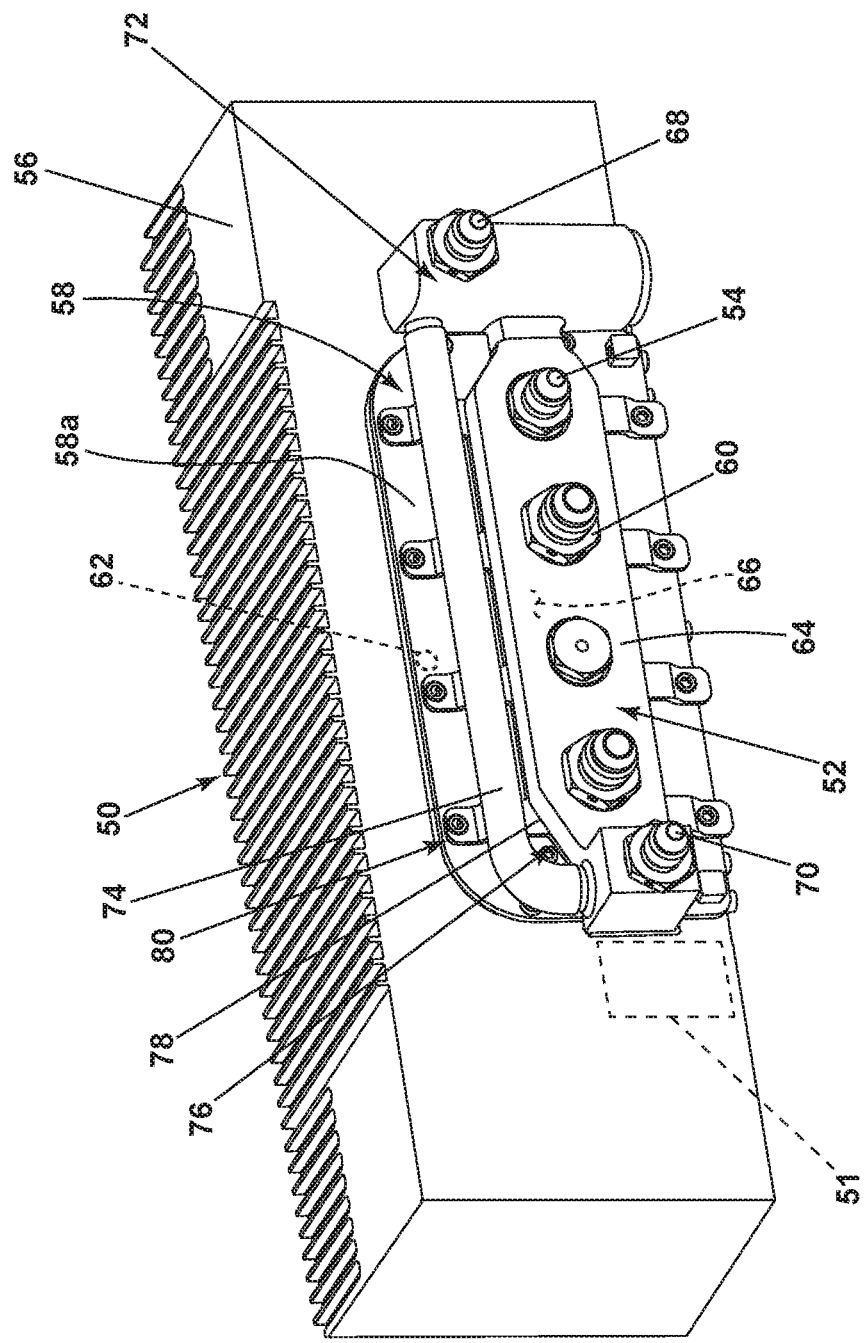
FIG. 2 is a perspective view of an exemplary PSS with a heat exchanger according to aspects of the present invention.

FIG. 2 illustrates a PSS 50 that can include pressure transducer(s), schematically illustrated at 51, which can act as a pressure detection system as part of an engine control assembly 42 (FIG. 1) regardless of whether the PSS 50 is incorporated in or separate from a FADEC system 46. For example, the PSS 50 can be separate from the FADEC and communicatively coupled thereto. The PSS 50 can be used to detect pressure through a cable, hose, channel, or pipe. At least one pressure input 54 is included in the PSS 50. The at least one pressure input 54 can be any suitable pressure input including, by way of non-limiting example, a nipple or nozzle that can be connected to the cable, hose, channel, tube or pipe. The at least one pressure input 54 is located on an exterior of a housing 56 of the PSS 50 and is in communication with a set of transducers 51 located within the housing 56. In the illustrated example, the at least one pressure input 54 is illustrated on a front face 58 of the housing 56, by way of non-limiting example. It will be understood that the PSS 50 can include any number and variety of other connectors 60; for example, these can include any suitable connectors including cable connectors. It is common, although not necessary, for the at least one pressure input 54 and the other connector(s) to all be located on the front face 58 for ease of usability. The front face 58 can be a separate body from a remainder of the housing 56 and can be fastened thereto to form an interior of the housing 56. By way of non-limiting example, the front face 58 has been illustrated as a plate, which can include a conductive plate 58a formed from a conductive material, such as a stainless steel plate or sheet or aluminum. On a rear surface (not shown) of the front face 58 a set of sensors 62 (shown in phantom as a single sensor for clarity) for the PSS 50 can be located, mounted, adjacent, or otherwise operably coupled thereto.

The heat exchanger 52 includes a body or housing 64 defining an interior 66 that is fluidly coupled to an inlet port 68 on a first side and an outlet port 70 on a second side, opposite the first side. A fluid passageway is defined within the interior 66. The housing 64 is configured with through passages or apertures 79 (FIG. 3) that extend from a first side 64a to a second side 64b of the housing. Any number of apertures 79 can be included in the housing 64 including at least one aperture. The apertures 79 are fluidly separate from the fluid pathway of the interior 66 of the heat exchanger. In this manner, the housing 64 of the heat exchanger 52 with its multiple apertures 79 as illustrated fits around the pressure input 54 and connectors 60 of the housing 56 of the PSS 50. In this manner, the housing 64 of the heat exchanger 52 conforms to an exterior of the PSS 50 such that the heat exchanger 52 is configured to be retro-fit onto an existing PSS 50. The housing 64 of the heat exchanger 52 can be formed in any suitable manner including that it can be a sheet-metal housing.

The inlet port 68 is operably coupled to a source of hot engine oil from the turbine engine assembly 10, such as via on of the connections 44 illustrated in FIG. 1. The outlet port 70 is also fluidly coupled via one of the connections 44 such that it returns engine oil that has flowed from the first side to the second side to the turbine engine assembly 10.

A valve 72 provides for flow control of the hot engine oil passing through to the interior 66 or through a bypass section 74 of the heat exchange 52. The valve 72 can be configured to control a bypass for at least a portion of the hot engine oil entering the inlet port 68 from the turbine engine assembly 10 and directing it back to the turbine engine assembly 10 prior to reaching the interior 66 of the housing 64 of the heat exchanger 52.

A backing plate 76 having a body 78 and legs 80 can be included in the heat exchanger 52 and can be utilized to mount the housing 64 to the front face 58. It is contemplated that portions of the body 78 can be flush with the housing 64 but spaced from the front face 58. More specifically, the backing plate 76, and therefore the heat exchanger 52, is held off of a portion of the front face 58 by the legs 80. The legs 80, as clearly illustrated, are mounted, fastened, or otherwise operably coupled to the front face 58. In this manner the heat exchanger 52 is configured to provide both convective, via any air gaps and spacing, and conductive heat to the front face 58. It will be understood that the backing plate 76 can be joined with the housing 64 of the heat exchanger 52 in any suitable manner including via welding, soldering, conductive adhesive, etc. A thermally conductive mounting mechanism is beneficial so that heat can be transferred via the backing plate 76 to the housing 56 of the PSS 50.

Figure 3:
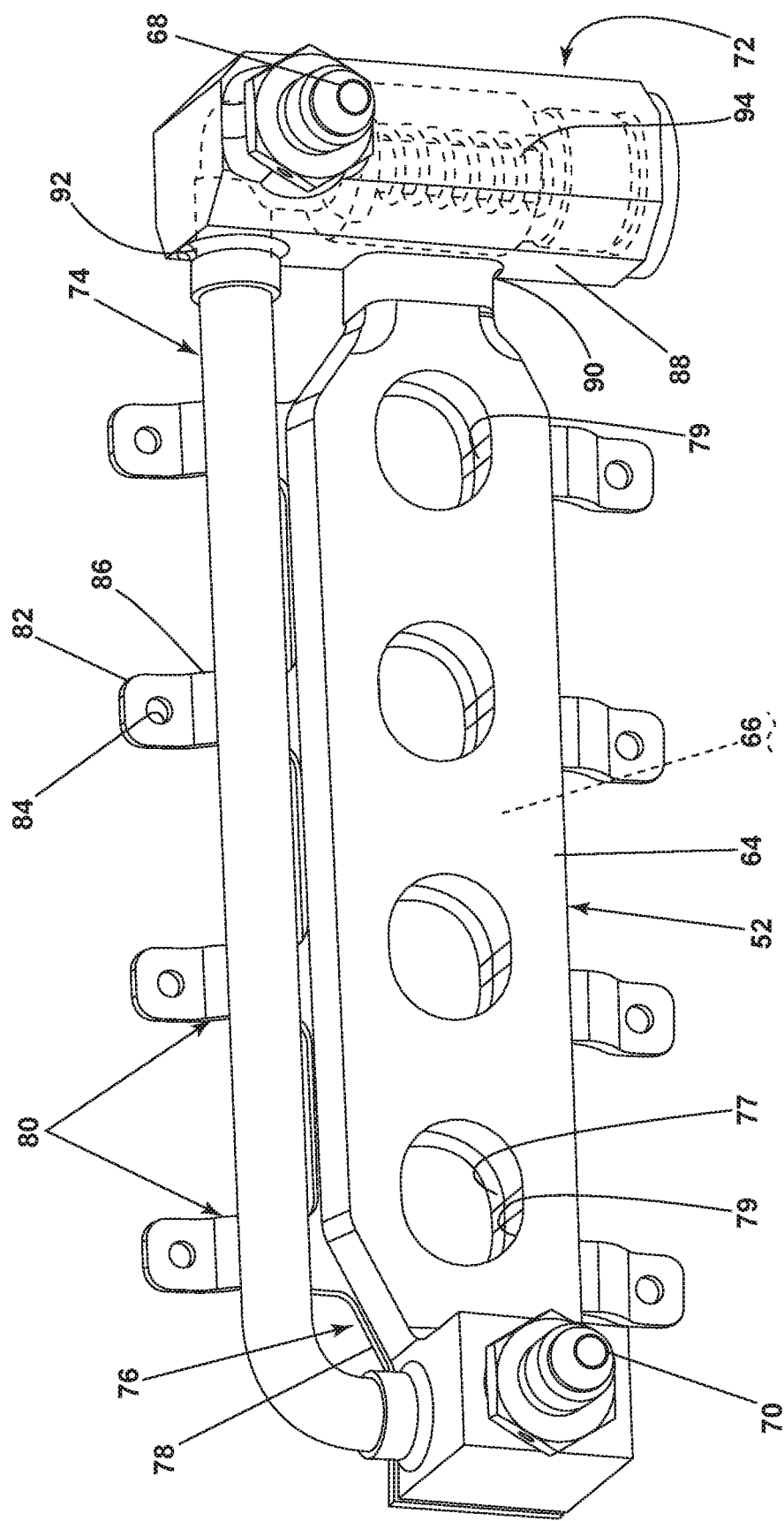
FIG. 3 is a perspective view of the heat exchanger of FIG. 2.

As illustrated more clearly in FIG. 3, one end of the legs 80 includes a mounting portion 82, each containing an aperture 84, used to retain a fastener utilized to mount or otherwise join the leg 80 to the front face 58. An elevated portion 86 of the leg 80 extends from the mounting portion 82 and attaches or is integrally formed with the backing plate 76. The backing plate 76 includes apertures 77 corresponding to apertures 79 in the housing 64 of the heat exchanger 52. The apertures 77 are configured to receive the pressure input 54 and connectors 60 such that the heat exchanger 52 having the backing plate 76 is configured to be retro-fit onto an existing PSS 50.

The valve 72 is also illustrated in more detail, including an exemplary manifold 88 fluidly coupled with the inlet port 68 and having a first outlet 90 fluidly coupled to the interior 66 and a second outlet fluidly coupled to the bypass section 74. When the valve 72 is open, the valve 72 fluidly couples the inlet 68 to the interior 66 via the manifold 88 and the first outlet 90. Further still, when the valve 72 is open, the valve 72 also fluidly couples inlet 68 with the bypass section 74 such that when the valve 72 is open some flow also flows through the bypass section 74. When the dissipation of heat from the hot engine oil is not required, the valve 72 allows at least a portion including for example most or essentially all of the hot engine oil to bypass the heat exchanger 52 via the bypass section 74 and return to the turbine engine assembly 10. More specifically, when the valve 72 is closed, the inlet 68 is fluidly coupled to the bypass section 74 via the second outlet 92.

In this manner, the valve 72 provides for flow control of the hot engine oil passing through the heat exchanger 52. The valve 72 can include any suitable valve type including a thermal or spring type poppet valve 94 or one controlled via a controller (not shown). It will be understood that the illustrated and explained valve is merely for exemplary purposes. Bypass valves can include pressure-actuated valves that are responsive to an increase in pressure or combined pressure and thermally actuated valves that are responsive to an increase in both pressure and temperature. Or a valve where a thermal actuator is driven by volume change of a wax contained therein subject to a phase change from a solid to a liquid in response to an increase in temperature.

In operation, the PSS 50 detects pressure as part of the FADEC system 46 or provides communication to the FADEC system 46 based thereon. Because of the environment within the nacelle 20 of the turbine engine assembly 10, evaporated water can enter the engine control assemblies 42 such as the PSS 50 or FADEC system 46. In the event of atmospheric water vapor condensing and freezing any sensors utilized therein, including for example the sensors 62, can provide inaccurate data or outputs. Therefore, during operation the heat exchanger 52 can be utilized to provide sufficient heat to unfreeze or keep such condensed water from freezing allowing the engine control assemblies 42 such as the PSS 50 or FADEC system 46 to function as intended. In addition to preventing freezing or thawing any water that has frozen within the housing 56, the heat exchanger 52 can also aid in evaporating any water therein.

More specifically, hot engine oil from the turbine engine assembly 10 is introduced into the inlet port 68 and flows through the interior 66 where it exchanges heat with the front face 58 via both conduction and convections and becomes cooler engine oil. The cooler engine oil exits out the outlet port 70 where it is returned to the turbine engine assembly 10 via connections 44. It is contemplated that one or more valves, thermal sensors, etc. can be included at other locations between the turbine engine assembly 10 and the heat exchanger 52 or that the hot engine oil can be at a temperature that is acceptable to the electronics within the PSS 50. Further still, the valve 72 can be utilized to control the flow of hot engine oil into the interior 66. When the valve 72 is open, the valve 72 directly fluidly couples the inlet port 68 to the interior 66 via the first outlet 90 of the valve 72. When the dissipation of heat from the hot engine oil is not required and the valve 72 is closed, the inlet port 68 is fluidly coupled to the bypass section 74 via the second outlet 92 and the still hot engine oil is returned to the turbine engine assembly 10 via connections 44. It is also contemplated that when a lower dissipation of heat from the hot engine oil is required and the valve 72 can be in a partially opened and partially closed position where the inlet port 68 is fluidly coupled to both the interior 66 and the bypass section 74.

One advantage is that the heat exchanger 52 conforms to the existing configuration of the electronic device or engine control assembly 42, in this case the PSS 50, and supplies heat via both convection and conduction to the housing 56. The heat that is applied to the front face 58 and the sensor(s) 62 can be sufficient to thaw frozen water while still limiting the temperature to acceptable levels by bypassing the hot engine oil, via the valve 72, when the temperature of the hot engine oil is too great to be tolerated by the electronic components.

Figure 4:
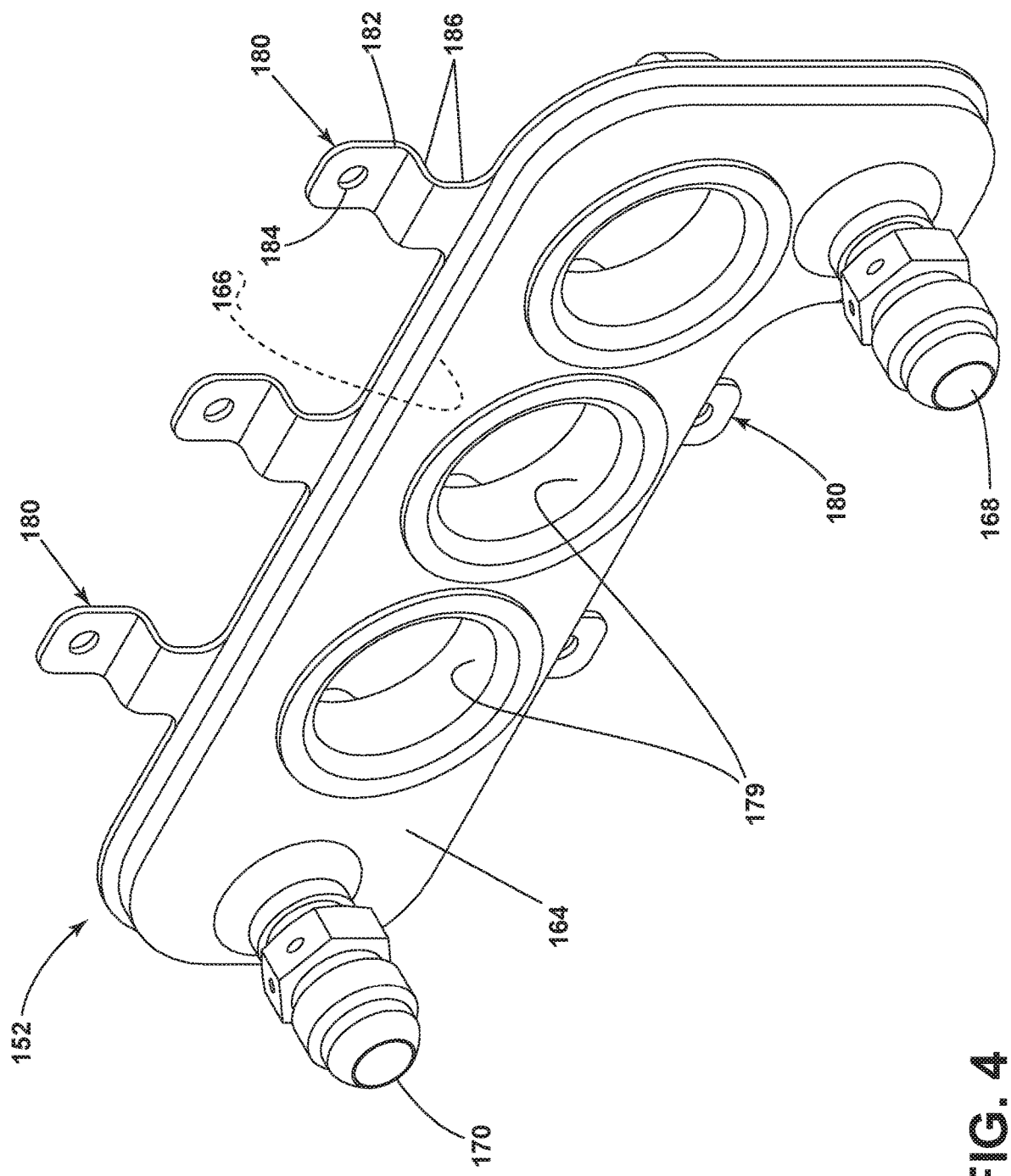
FIG. 4 is a front perspective view of a heat exchanger that can be utilized according to an aspect of the present disclosure.

FIG. 4 illustrates another heat exchanger 152 that can be utilized with the electronic devices within the nacelle 20 of the turbine engine assembly 10 (FIG. 1) such as the PSS 50 of FIG. 2. The heat exchanger 152 is similar to the heat exchanger 52 previously described and therefore, like parts will be identified with like numerals increased by 100, with it being understood that the description of the like parts of the heat exchanger 52 applies to the heat exchanger 152, unless otherwise noted.

Similarities include that a housing 164 defines an interior 166 that is fluidly coupled to an inlet port 168 on a first side and an outlet port 170 on a second side, opposite the first side. A fluid passageway is defined within the interior 166. The housing 164 is configured with through passages or apertures 179 such that the housing 164 fits around any inputs or connectors of the PSS 50 (FIG. 2). A different number of aperture are included and it will be understood that the PSS can have any number of inputs or connectors or that the heat exchanger 152 only fits around a subset of the inputs and connectors of the PSS 50. Further, the heat exchanger 152 can include legs 180 includes a mounting portion 182, each containing an aperture 184, used to retain a fastener utilized to mount or otherwise join the leg 180 to the PSS 50 (FIG. 2). An elevated portion 186 of the leg 180 extends from the mounting portion 182.

One difference is that the heat exchanger 152 does not include a valve or a bypass section. Any hot engine oil introduced into the inlet port 168 flows through the interior 166 and out the outlet port 170 where it is returned to the turbine engine assembly 10. It is contemplated that one or more valves, thermal sensors, etc. can be included at other locations between the turbine engine assembly 10 and the heat exchanger 152 to control the flow of hot engine oil or that the hot engine oil can be at a temperature that is acceptable to the electronics within the PSS 50 if the hot engine oil is continuously fed through the heat exchanger 152.

Another difference is that the legs 182 extend directly from the housing 164. This can also be seen more clearly in FIG. 5, which illustrates a rear view of the heat exchanger 152. A backing plate 176 is still included and attached to the housing 164; however, the body 178 of the backing plate 176 includes extensions 198, which create additional conductions surfaces or thermal pathways for heat to transfer from the heat exchanger 52 to the front face 58 (FIG. 2).

The operation of the heat exchanger 152 is much like that of the heat exchanger 52 except that there is no bypass for the hot engine oil.

One skilled in the art would recognize the additional or alternative aspects of the disclosure shown in FIGS. 6-17. The heat exchangers are similar to the heat exchangers previously described and therefore, like parts will be identified with like numerals increased by 100 for each figure, with it being understood that the previous description of the like parts applies, unless otherwise noted.

Figure 6:
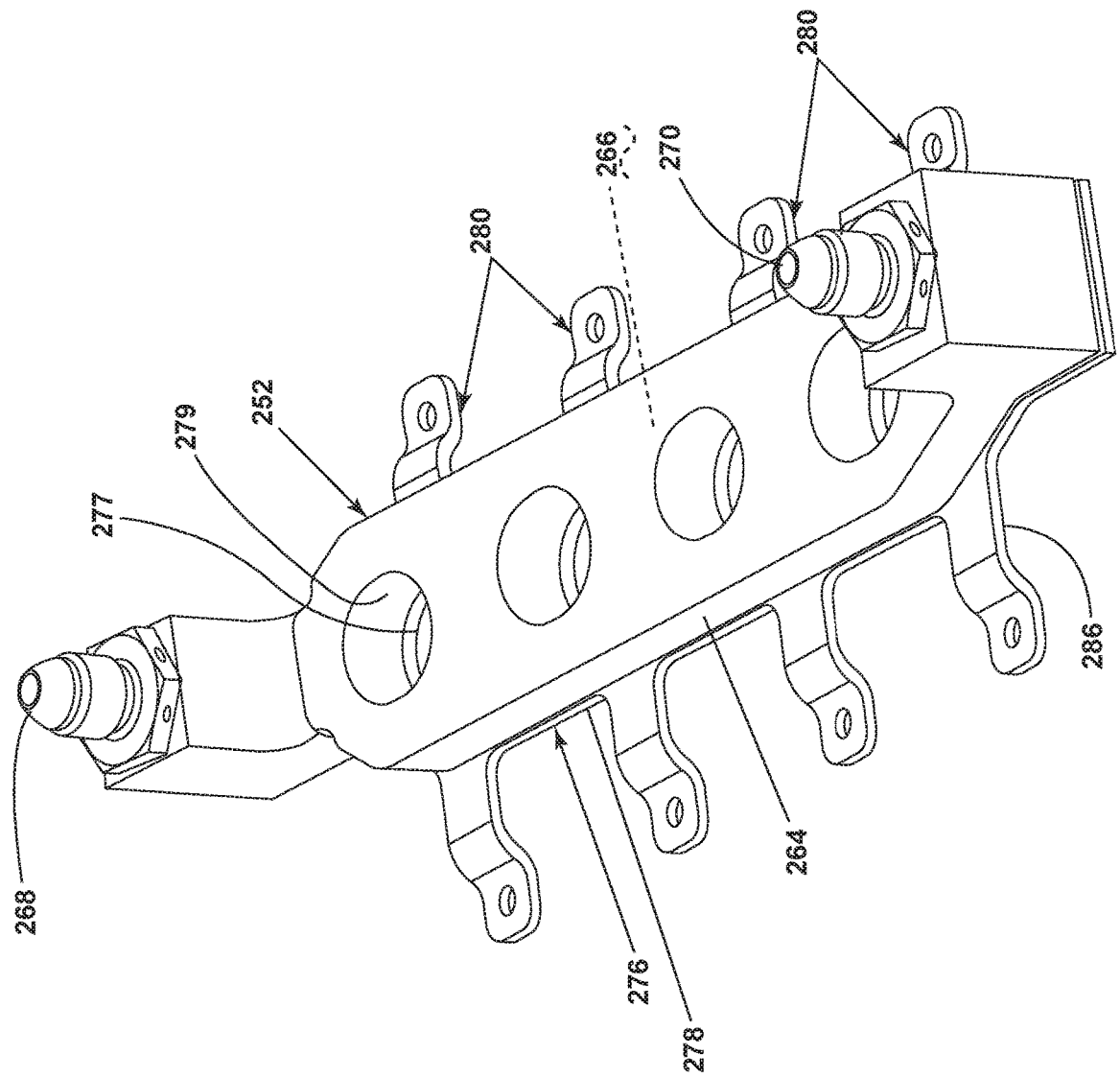
FIG. 6 is a perspective view of a heat exchanger that can be utilized according to an aspect of the present disclosure.

FIG. 6 illustrates a heat exchanger 252 having a housing 264 that defines an interior 266 fluidly coupled to an inlet port 268 on a first side and an outlet port 270 on a second side, opposite the first side. A fluid passageway is defined within the interior 266. The housing 264 is configured with through passages or apertures 279 and the body 278 of the backing plate 276 includes corresponding apertures 277. Legs 280 having elevated portions 286 extend from the backing plate 276. No bypass section is included and the inlet port 168 and the outlet port 270 are aligned laterally along a length of the heat exchanger 252 without the use of a valve.

Figure 7:
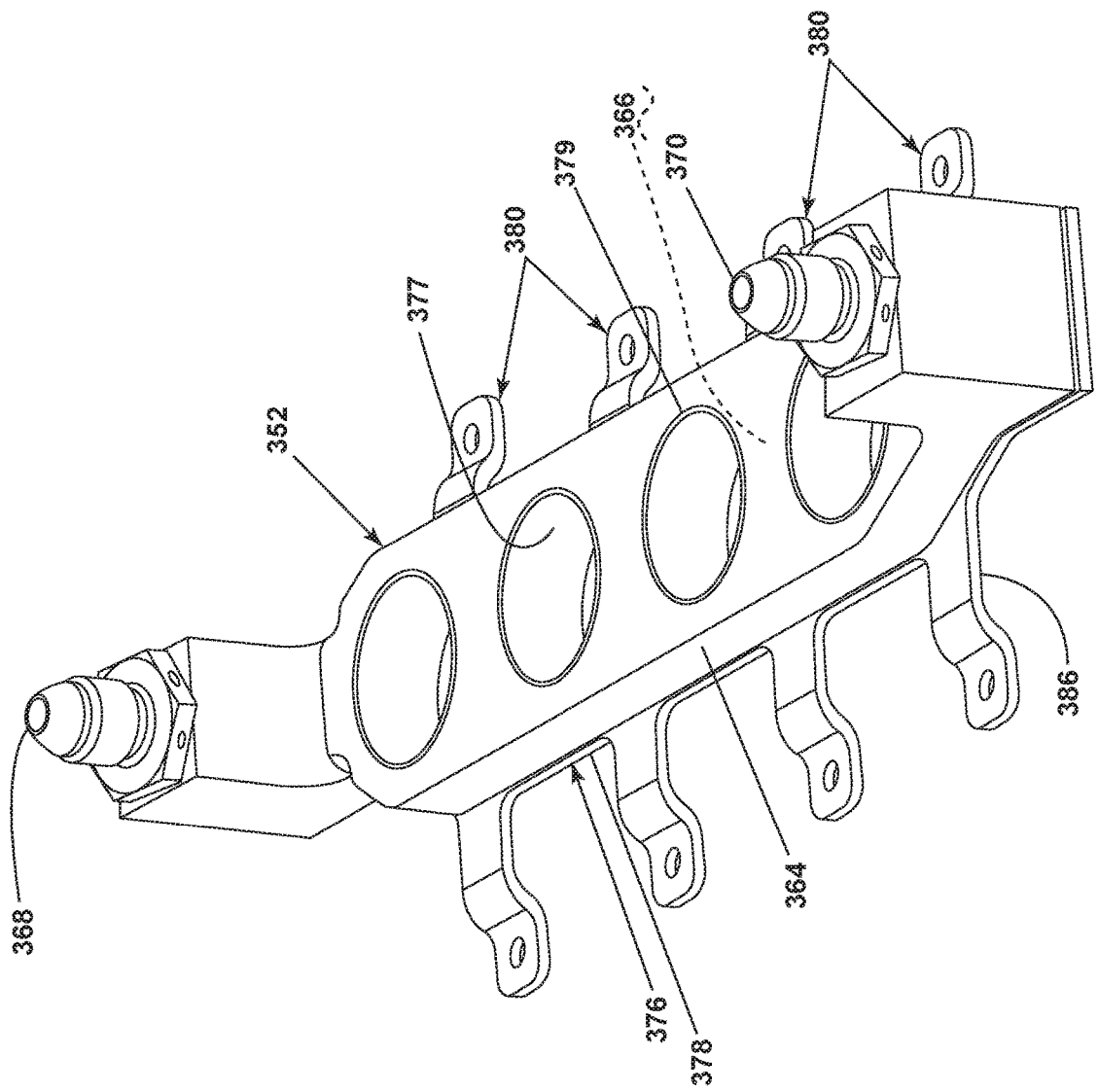
FIG. 7 is a perspective view of a heat exchanger that can be utilized according to an aspect of the present disclosure.

FIG. 7 is much like FIG. 6 including that the heat exchanger 352 includes a housing 364 that defines an interior 366 fluidly coupled to an inlet port 368 and an outlet port 370. A fluid passageway is defined within the interior 366. The housing 364 is configured with through passages or apertures 379 and legs 380 having elevated portions 386 extend from the body 378 of the backing plate 376. A difference includes that the backing plate 376 extends into the apertures 379 of the housing 364 such that apertures 377 formed by the backing plate 376 line the apertures 379 of the housing 364.

Figure 8:
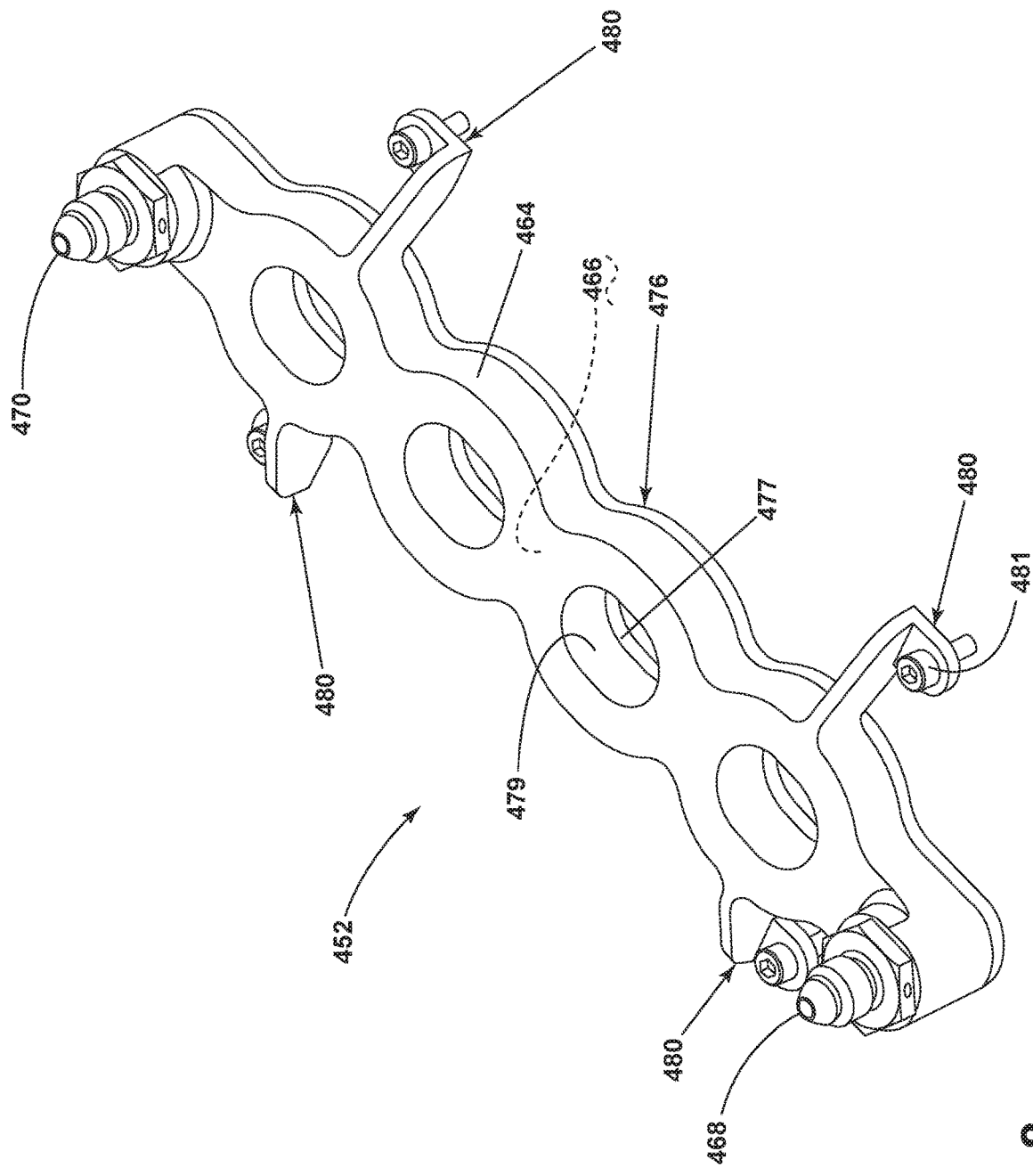
FIG. 8 is a perspective view of a heat exchanger that can be utilized according to an aspect of the present disclosure.

FIG. 8 includes a heat exchanger 452 having a more undulating peripheral profile for its housing 464. An interior 466 is defined within the housing 464 and is fluidly coupled to an inlet port 468 on a first side and an outlet port 470. The housing 464 is configured with through passages or apertures 479 and the backing plate 476 includes corresponding apertures 477. Further still, the legs 480 have planar portions with mounting facets through which fasteners 481 extend. It will be understood that the legs 480 can include any suitable shape, profile, or contour. The inlet port 468 and outlet port 470 also have a lower profile to the housing 464.

Figure 9:
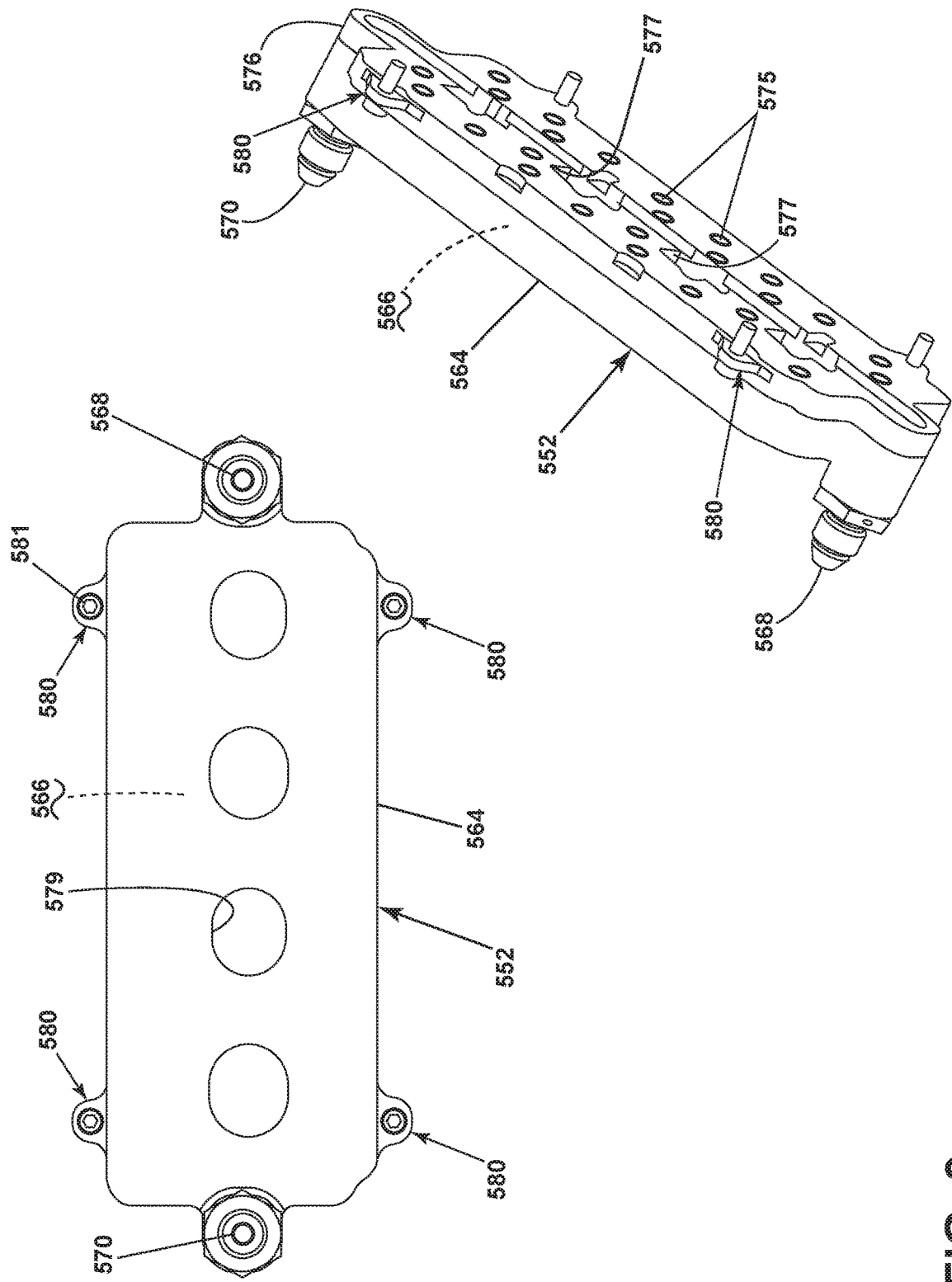
FIG. 9 is a front and perspective view of a heat exchanger that can be utilized according to an aspect of the present disclosure.

The heat exchanger 552 illustrated in FIG. 9 has a block-shaped housing 564 defining an interior 566, which is fluidly coupled to an inlet port 568 and an outlet port 570. Apertures 579 extend through the housing 564. One difference is that simpler legs 580 do not have upward extension sections, which means that the backing plate 576 is not spaced from the front face 58 (FIG. 2) when fasteners 581 coupled the heat exchanger 552 to the PSS 50 (FIG. 2). Further still, non-circular apertures 577 and a plurality of cavities 575 are located within the backing plate 576 to reduce weight and form air gaps therein. The air gaps can be utilized to adjust the heat transfer rate through the backing plate 576.

Figure 10:
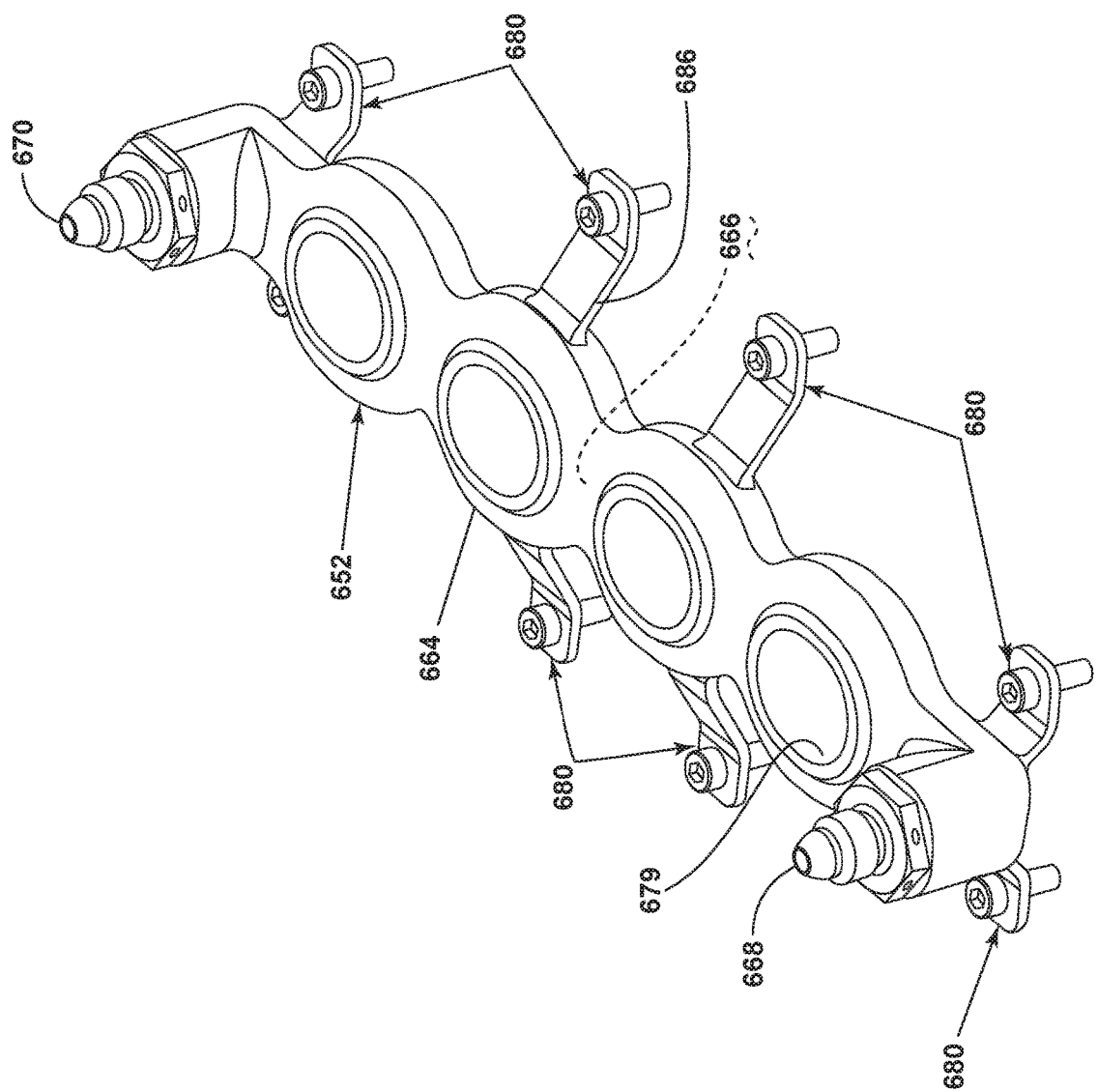
FIG. 10 is a perspective view of a heat exchanger that can be utilized according to an aspect of the present disclosure.

FIG. 10 has a heat exchanger 652, which has a housing 664 that also includes a more curved peripheral profile and does not include a backing plate. An interior 666 is defined within the housing 664 and inlet port 668 is located at one end while outlet port 670 is located at the other. Apertures 679 extend through the housing 664. Legs 680 of varying sizes, some including elevated portions 686, are used to retain the heat exchanger 652.

Figure 11:
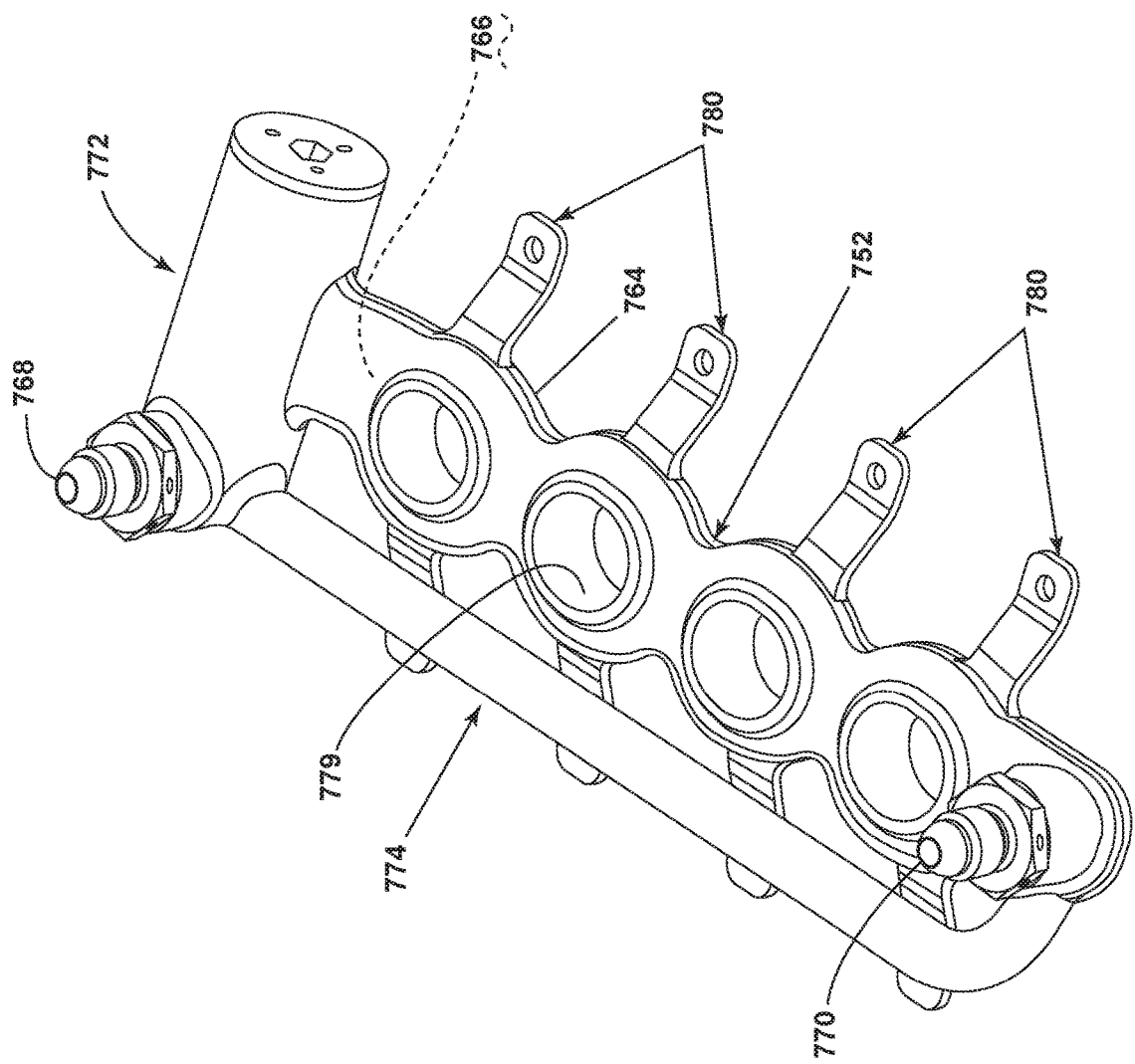
FIG. 11 is a perspective view of a heat exchanger that can be utilized according to an aspect of the present disclosure.

The heat exchanger 752 of FIG. 11 is similar to that of FIG. 10 and also includes an interior 766 is defined within a housing 764 having an inlet port 768 and an outlet port 770 located at opposite ends of the housing 764 and apertures 779 extending therethrough. One difference is that the heat exchanger 752 except includes a valve 772 and a bypass portion 774. Further still, legs 780 are more symmetrical than the legs in FIG. 10.

Figure 12:
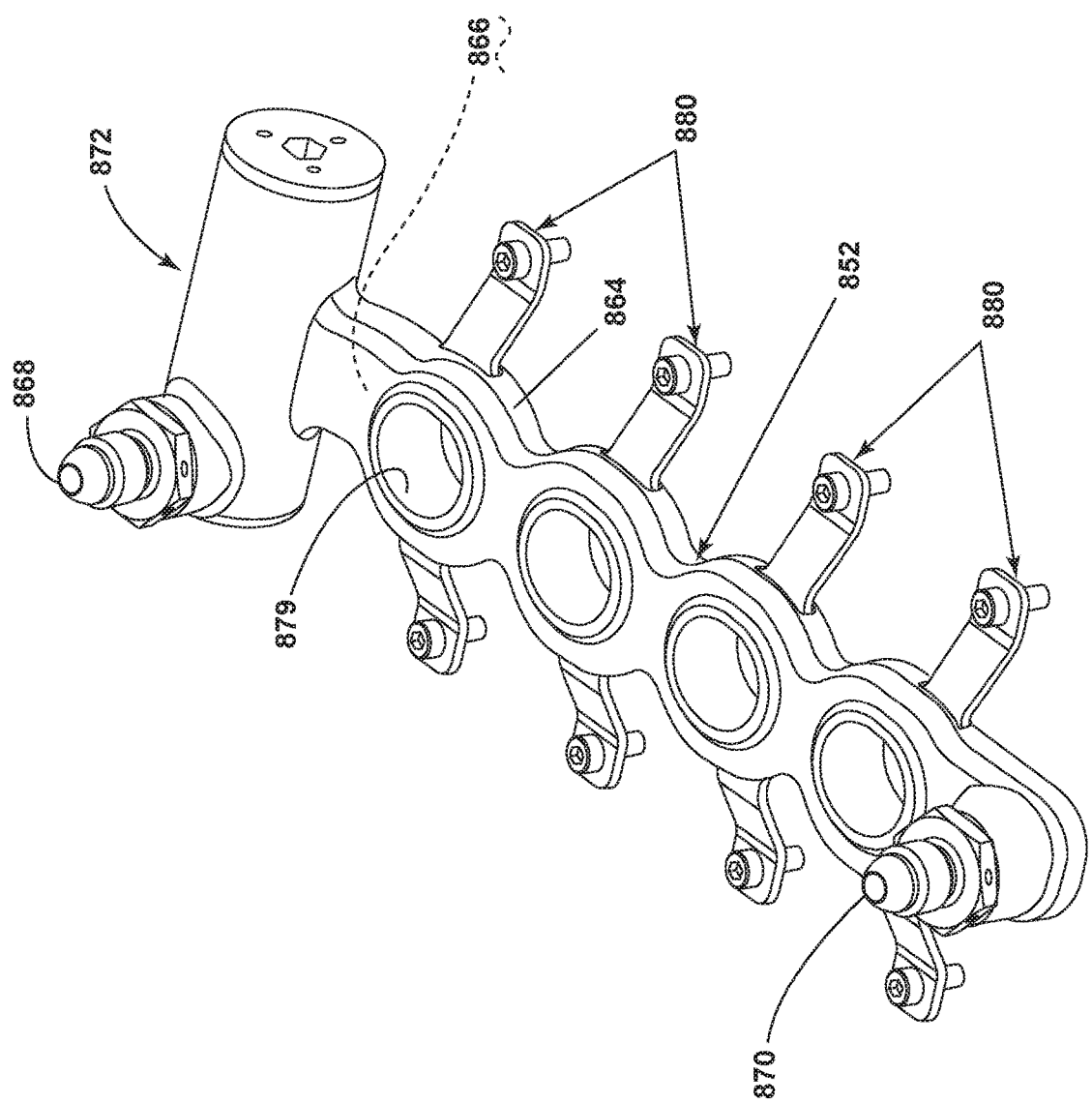
FIG. 12 is a perspective view of a heat exchanger that can be utilized according to an aspect of the present disclosure.

FIG. 12 is similar to that of FIG. 11 as the heat exchanger 852 also includes a housing 864 defining an interior 866. Apertures 879 extend through the housing and an inlet port 868 and an outlet port 870 are located at opposite ends of the housing 864. A valve 872 is located at the inlet port 868 to control the flow of fluid through the interior 866. Legs 880 can be utilized to mount the heat exchanger 852. One difference is that the heat exchanger 852 does not include a bypass section.

Figure 13:
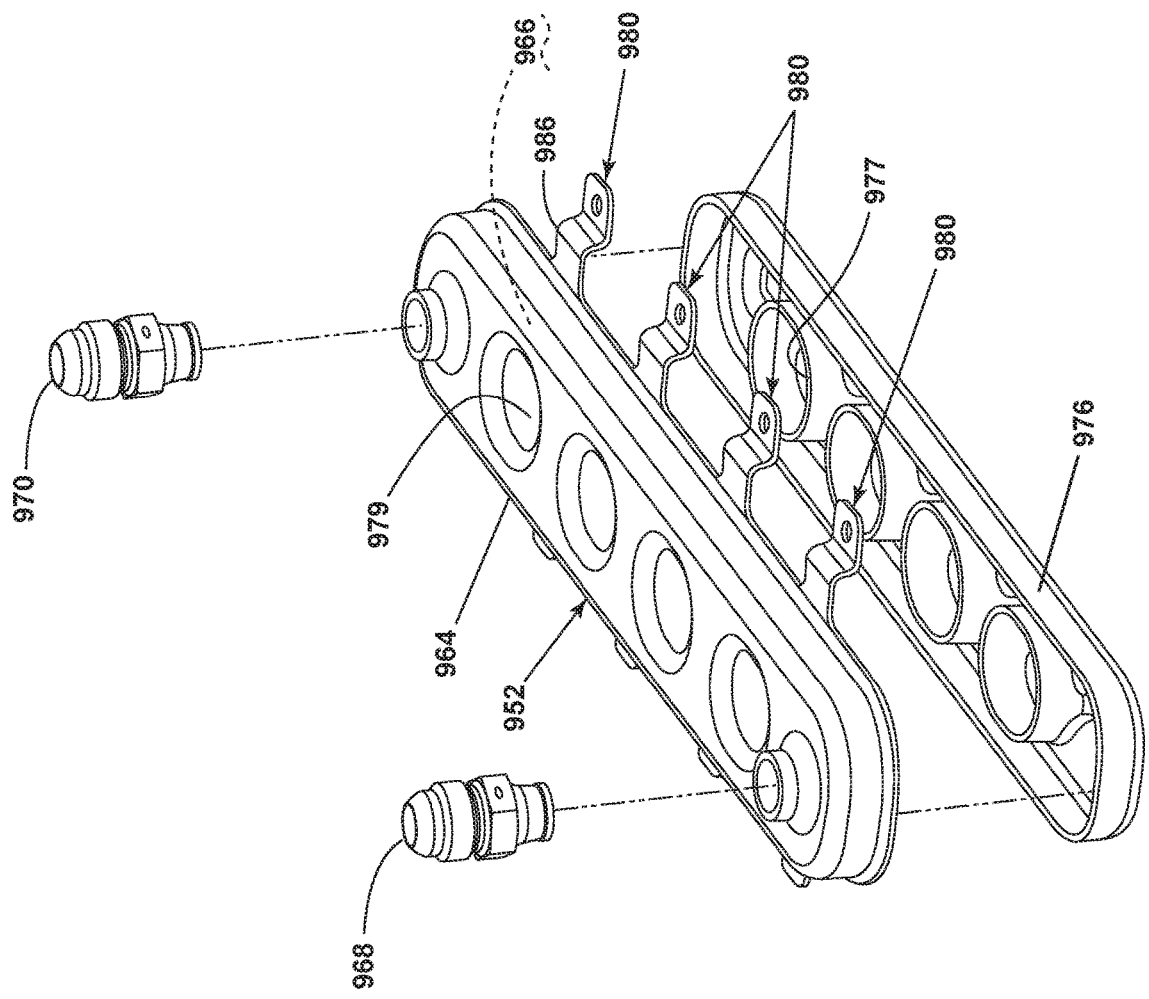
FIG. 13 is a perspective view of a heat exchanger that can be utilized according to an aspect of the present disclosure.

The heat exchanger 952 of FIG. 13 is shown exploded so that it can be more easily seen that the interior 966 is define by the housing 964 and the backing section 976. More specifically, the backing section 976 forms a trough or well within which at least a portion of the housing 964 can be retained. An inlet port 968 and an outlet port 970 extend from opposite ends of the housing 964. Portions of the backing section 976 extend upwards to define apertures 977 that are complementary with respective apertures 979 within the housing 964 to allow for thermal conduction therebetween. It is also contemplated that the backing plate can form a portion of the housing and define portions of the interior, although this need not be the case. Legs 980 including elevated portions 986 extend from the housing 964.

Figure 14:
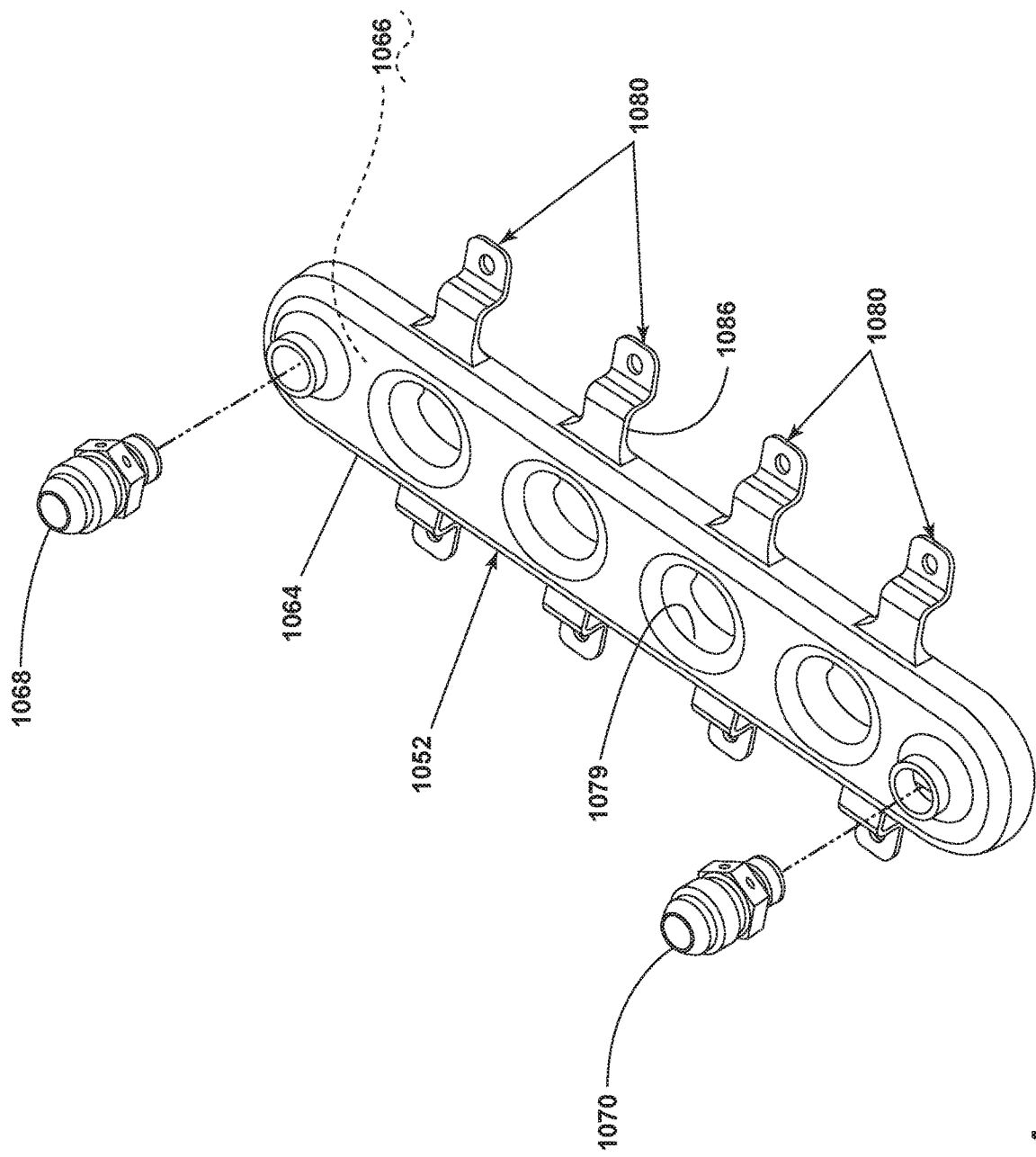
FIG. 14 is a perspective view of a heat exchanger that can be utilized according to an aspect of the present disclosure.

FIG. 14 illustrates where the heat exchanger 1052 is a single piece, integral housing, or unitary housing 1064 to which the inlet port 1068 and the outlet port 1070 can be directly attached. Interior 1066 is defined within the unitary housing 1064 and apertures 1079 pass therethrough. There is no backing plate illustrated and the legs 1080, including elevated portions 1086, can be mounted, attached, or coupled with the unitary housing 1064 in any suitable manner.

Figure 15:
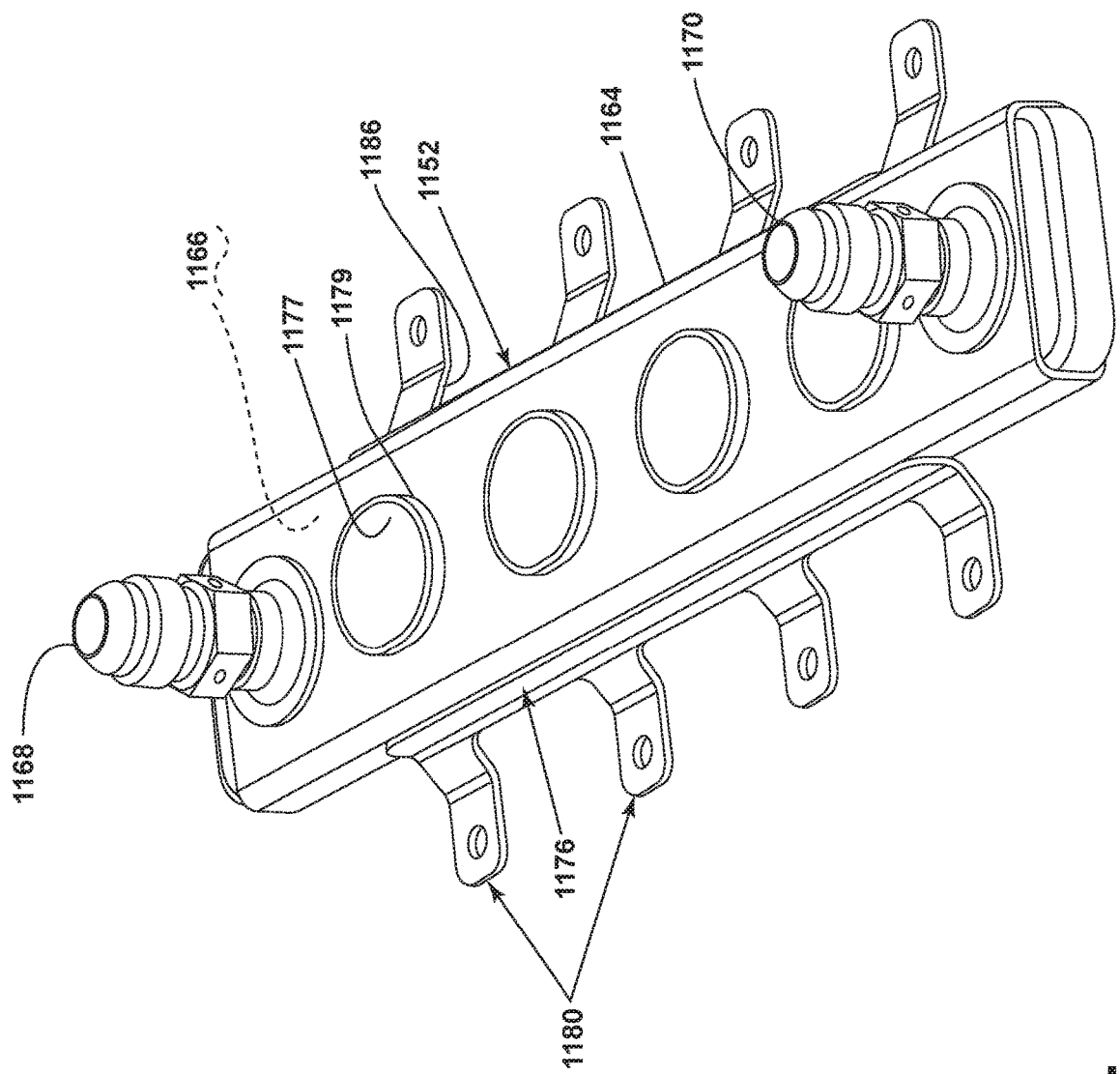
FIG. 15 is a perspective view of a heat exchanger that can be utilized according to an aspect of the present disclosure.

FIG. 15 includes a complex configuration of a heat exchanger 1152 having an interior 1166 defined by a housing 1164 to which an inlet port 1168 and an outlet port 1170 can be coupled. The legs 1180 extend from the backing plate 1176 and the backing plate 1176 extends upwardly along portions of the housing 1164 including within the apertures 1179 to define apertures 1177. Further still, the backing plate 1176 extends along lateral ends of the housing 1164 and partially along sidewalls of the housing 1164.

Figure 16:
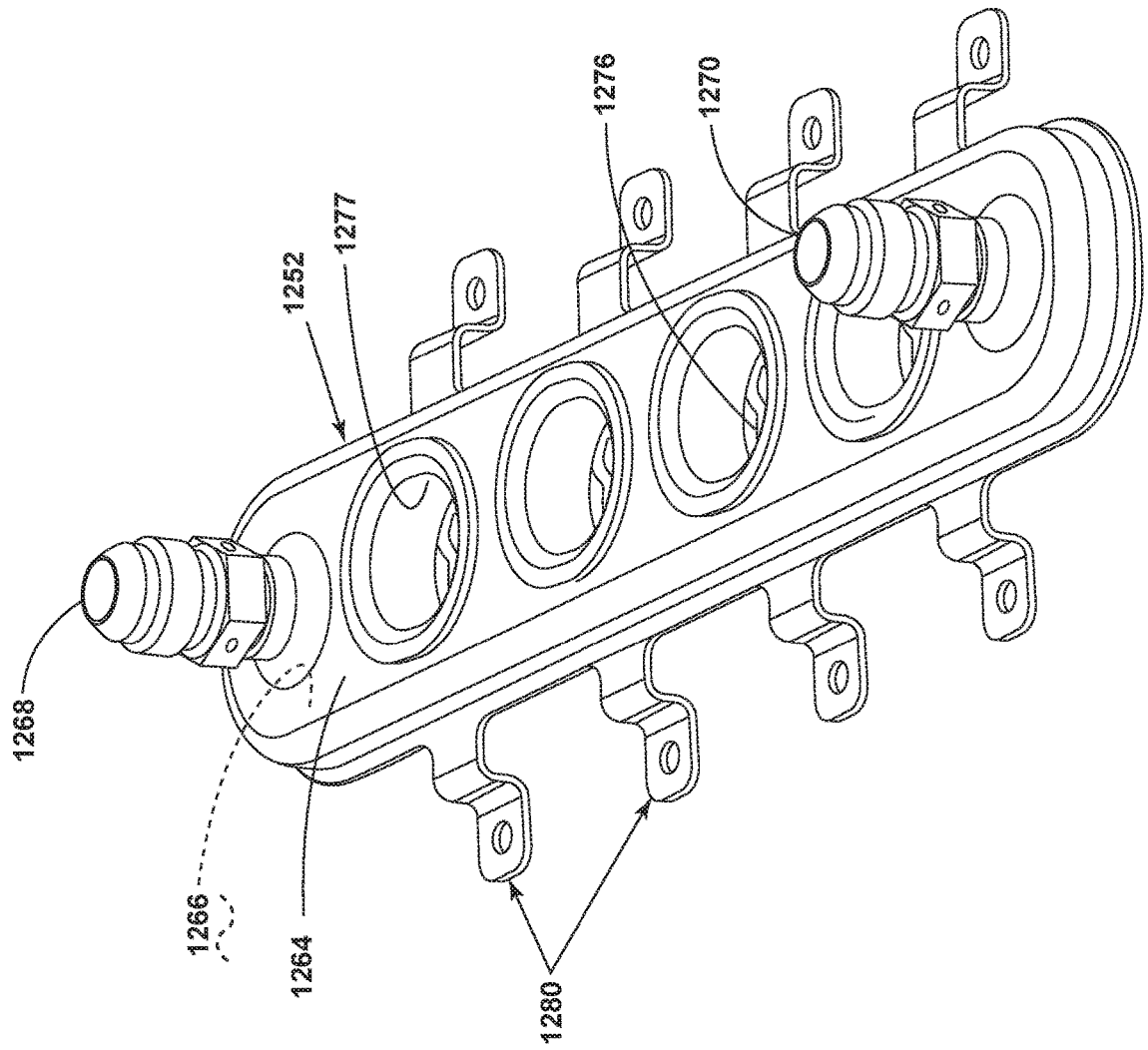
FIG. 16 is a perspective view of a heat exchanger that can be utilized according to an aspect of the present disclosure.

FIG. 16 also includes a more complex configuration of a heat exchanger 1252 with a housing 1264 defining an interior 1266 and having an inlet port 1268 and an outlet port 1279. Legs 1280 extend directly off from the housing 1264 and the backing plate 1276 has protrusions along the bottom surface and that extend upwardly at 1277 and outwardly in a lip past the apertures (not shown) in the housing 1264.

Figure 5:
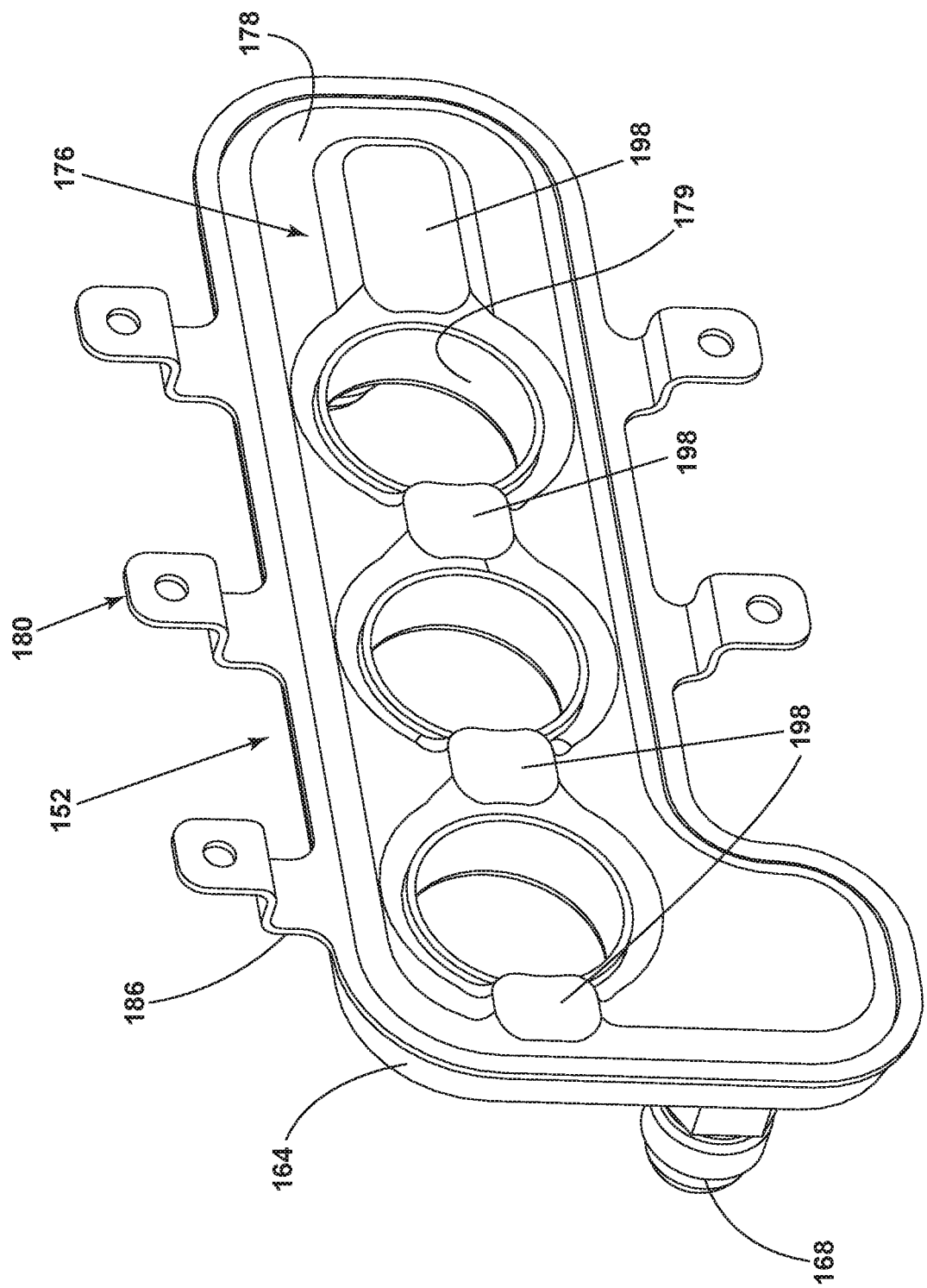
FIG. 5 is a back perspective view of the heat exchanger of FIG. 4.
Figure 17:
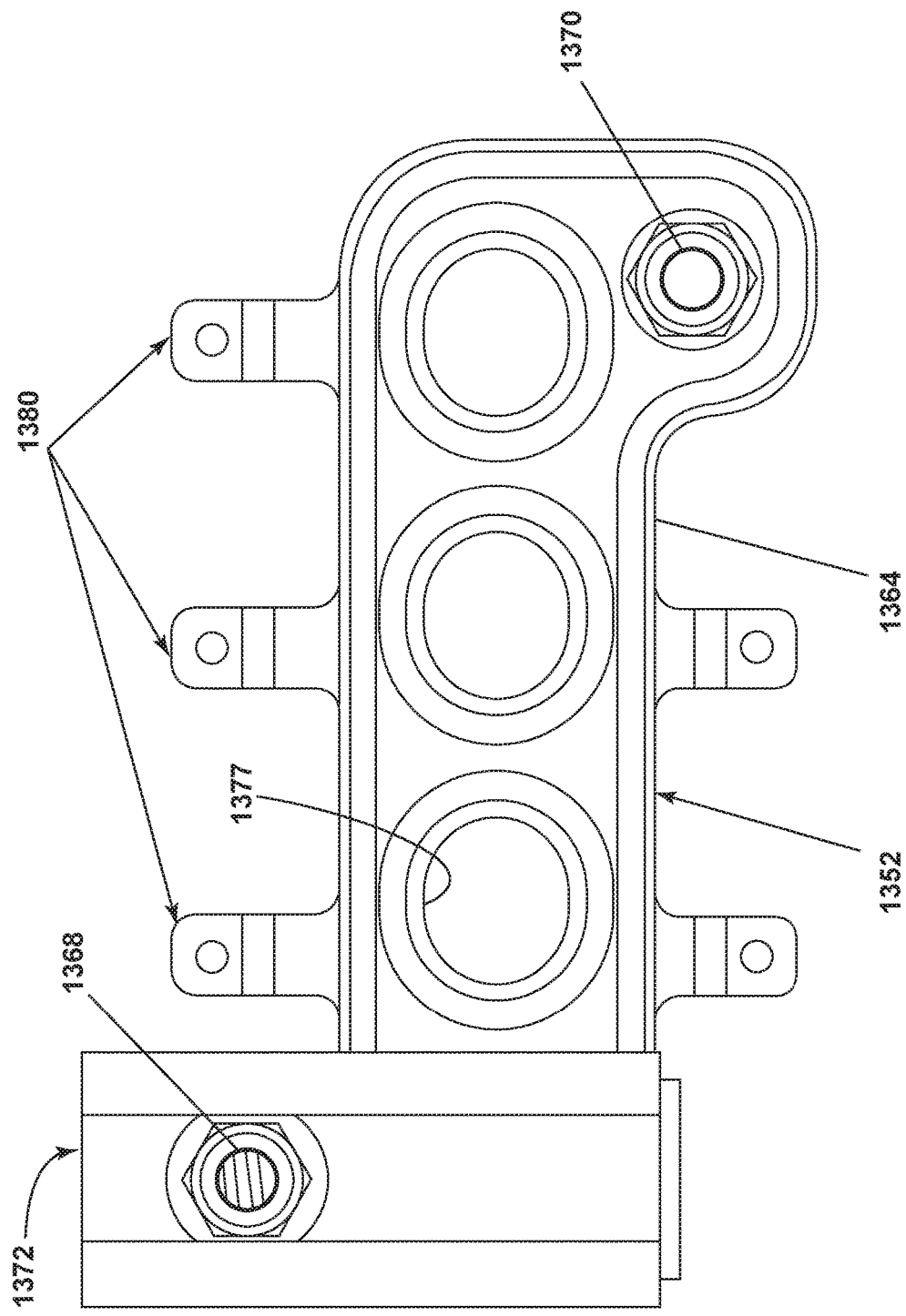
FIG. 17 is a front perspective view of a heat exchanger that can be utilized according to an aspect of the present disclosure.

The heat exchanger 1352 illustrates in FIG. 17 is similar to the configurations shown in FIGS. 4 and 5. A housing 1364 includes an inlet pot 1368 and an outlet port 1370. One difference is that a valve 1372 has been included at the inlet port 1368. Interior apertures 1377 are defined and legs 1380 are utilized for mounting.

It is also contemplated for any of the above heat exchangers that a thermally conductive paste can be utilized to further aid in heat transfer from the heat exchanger to the front face.

Aircraft turbine engines are controlled by complex electronic devices such as FADEC and PSS units. These devices can be adversely impacted by the engine environment such as frozen water or freezing condensate. Therefore, such devices may need to be heated in order to function properly. Aspects of the present disclosure include unique conformal heat exchangers to control the temperature of these electronic devices to assure their proper operation. An exemplary technical effect of the systems and methods described herein includes at least one of supplying heat via at least one of convection or conduction to the regions requiring heat while at the same time limiting the temperature to acceptable levels by bypassing the hot fluid when the temperature of the fluid is too great to be tolerated by the electronic components and increasing the service life of core-mounted engine accessories. A number of benefits include that the heat exchangers can be added to existing systems in the field as the heat exchangers are configured to work by conforming to the existing configuration of the electronic device. Another benefit is that the heat exchangers work by supplying heat via at least one of convection or conduction to the regions requiring heat. Further still, some of the heat exchangers can limit, via valving or a bypass section, the temperature to acceptable levels.

It will be understood that aircraft turbine engines are controlled by complex electronic devices such as FADEC and PSS units. These devices can be adversely impacted by the engine environment including the condensing of evaporated water. Aspects of the present disclosure include unique conformal heat exchangers to control the temperature of these electronic devices to assure their proper operation. In accordance with aspects of the present disclosure, any of the aspects described above can be utilized in a method of operation for controlling temperature in an electronics device. The method can begin by flowing heat exchange fluid from a portion of a turbine engine assembly through the connections to a heat exchanger that is operably coupled to an electronics device located within the nacelle of the turbine engine and conveying heat from the flowing heat exchange fluid to an interior of the electronics device to at least one of increase a temperature of the electronics device, thaw frozen ice in the electronics device, prevent freezing of water in the electronics device, or evaporate water in the electronics device. It will also be understood that the flowing of heat exchange fluid can include controlling an inlet valve or controlling a bypass of the heat exchange fluid through a bypass fluid pathway. It will be understood from the above description can be any suitable fluid including hot engine oil.

To the extent not already described, the different features and structures of the various embodiments may be used in combination with each other as desired. That one feature may not be illustrated in all of the embodiments is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure. For example, while the heat exchanger has been illustrated and described as being mounted on the PSS or retro-fit thereto it will be understood that aspects of the invention can be applied to the FADEC as well as other devices where temperatures should be moderated.

Further aspects of the invention are provided by the subject matter of the following clauses:

1. Avionics control assembly, comprising: an engine control device having an avionics housing defining an exterior and an interior, with at least one connector extending from the exterior of the avionics housing and at least one sensor located within the interior; and a heat exchanger having a heat exchanger housing defining a fluid pathway including at least one fluid passageway leading from an inlet port of the heat exchanger to an outlet port of the heat exchanger, the heat exchanger housing have a first side and a second side, opposite the first side where the heat exchanger housing includes at least one aperture extending through the heat exchanger housing from the first side to the second side and where the aperture is fluidly separate from the fluid pathway, where the heat exchanger is operably coupled to the exterior of the avionics housing with the at least one connector located within the aperture and heat from liquid flowing through the fluid pathway is transferred via at least one of conduction or convection to the avionics housing.

2. The avionics control assembly of any preceding clause wherein at least a portion of the heat exchanger is spaced from the exterior of the avionics housing and the heat is transferred via both conduction and convection to the avionics housing.

3. The avionics control assembly of any preceding clause, further comprising a backing plate mounted to the second side of the heat exchanger housing.

4. The avionics control assembly of any preceding clause, further comprising a set of legs with elevated portions extending from the backing plate and spacing the backing plate away from the exterior of the avionics housing.

5. The avionics control assembly of any preceding clause wherein the backing plate comprises a planar body with at least one extension protruding from a surface thereof, the at least one extension configured to form an additional thermal pathway to conductively transfer heat from the heat exchanger to the exterior of the avionics housing.

6. The avionics control assembly of any preceding clause wherein the backing plate comprise a planar body having a through-passage configured for the at least one connector to pass therethrough.

7. The avionics control assembly of any preceding clause, further comprising a bypass heat exchange fluid pathway that connects the inlet port of the heat exchanger to the outlet port, bypassing the heat exchanger and a bypass valve configured to control fluid communication between the inlet port and the heat exchange fluid pathway.

8. The avionics control assembly of any preceding clause, further comprising a set of legs with elevated portions extending from the heat exchanger housing and spacing the second side of the heat exchanger away from the exterior of the avionics housing.

9. The avionics control assembly of any preceding clause, further comprising a backing plate mounted to the second side of the heat exchanger housing and having a set of legs extending from the backing plate and mounting the heat the heat exchanger to the exterior of the avionics housing.

10. The avionics control assembly of any preceding clause wherein a portion of the backing plate extends about a portion of the heat exchanger housing.

11. The avionics control assembly of any preceding clause wherein the portion of the backing plate lines the aperture.

12. The avionics control assembly of any preceding clause wherein the portion of the backing plate extends along a periphery of the heat exchanger housing.

13. The avionics control assembly of any preceding clause, further comprising a valve configured to control fluid communication between the inlet port and the fluid pathway.

14. The avionics control assembly of any preceding clause, further comprising a bypass heat exchange fluid pathway that connects the inlet port of the heat exchanger to the outlet port, bypassing the heat exchanger and a bypass valve configured to control fluid communication between the inlet port and the heat exchange fluid pathway.

15. The avionics control assembly of any preceding clause, further comprising a heat exchange fluid in the heat exchanger.

16. The avionics control assembly of any preceding clause wherein the heat exchange fluid includes oil.

17. The avionics control assembly of any preceding clause wherein the engine control device is a full authority digital engine control device or a pressure subsystem engine control device.

18. A method of controlling temperature in an electronics device having an avionics housing, the method comprising: flowing heat exchange fluid from a portion of a turbine engine to a heat exchanger that is operably coupled to an electronics device located within a nacelle of a turbine engine where the heat exchanger includes a heat exchanger housing defining a fluid pathway including at least one fluid passageway leading from an inlet port of the heat exchanger to an outlet port of the heat exchanger, the heat exchanger housing have a first side and a second side, opposite the first side where the heat exchanger housing includes at least one aperture extending through the heat exchanger housing from the first side to the second side and where the aperture is fluidly separate from the fluid pathway, where the heat exchanger is operably coupled to the exterior of the avionics housing with at least one connector of the electronics device located within the aperture; and conveying heat from the flowing heat exchange fluid to an interior of the electronics device via at least one of convection or conduction to at least one of increase a temperature of the electronics device, thaw frozen ice in the electronics device, prevent freezing of water in the electronics device, or evaporate water in the electronics device.

19. The method of any preceding clause wherein the heat exchange fluid is engine oil.

20. The method of any preceding clause wherein the flowing heat exchange fluid further comprises controlling a bypass of the heat exchange fluid through a bypass fluid pathway. To the extent not already described, the different features and structures of the various non-limiting permutations can be used in combination, or in substitution with each other as desired.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. Avionics control assembly, comprising:
an engine control device having an avionics housing defining an exterior and an interior, with at least one connector extending from the exterior of the avionics housing and at least one sensor located within the interior; and
a heat exchanger having a heat exchanger housing defining a fluid pathway including at least one fluid passageway leading from an inlet port of the heat exchanger to an outlet port of the heat exchanger, the heat exchanger housing have a first side and a second side, opposite the first side where the heat exchanger housing includes at least one aperture extending through the heat exchanger housing from the first side to the second side and where the aperture is fluidly separate from the fluid pathway, where the heat exchanger is operably coupled to the exterior of the avionics housing with the at least one connector located within the aperture and heat from liquid flowing through the fluid pathway is transferred via at least one of conduction or convection to the avionics housing.

2. The avionics control assembly of claim 1 wherein at least a portion of the heat exchanger is spaced from the exterior of the avionics housing and the heat is transferred via both conduction and convection to the avionics housing.

3. The avionics control assembly of claim 2, further comprising a backing plate mounted to the second side of the heat exchanger housing.

4. The avionics control assembly of claim 3, further comprising a set of legs with elevated portions extending from the backing plate and spacing the backing plate away from the exterior of the avionics housing.

5. The avionics control assembly of claim 3 wherein the backing plate comprises a planar body with at least one extension protruding from a surface thereof, the at least one extension configured to form an additional thermal pathway to conductively transfer heat from the heat exchanger to the exterior of the avionics housing.

6. The avionics control assembly of claim 3 wherein the backing plate comprise a planar body having a through-passage configured for the at least one connector to pass therethrough.

7. The avionics control assembly of claim 6, further comprising a bypass heat exchange fluid pathway that connects the inlet port of the heat exchanger to the outlet port, bypassing the heat exchanger and a bypass valve configured to control fluid communication between the inlet port and the heat exchange fluid pathway.

8. The avionics control assembly of claim 2, further comprising a set of legs with elevated portions extending from the heat exchanger housing and spacing the second side of the heat exchanger away from the exterior of the avionics housing.

9. The avionics control assembly of claim 1, further comprising a backing plate mounted to the second side of the heat exchanger housing and having a set of legs extending from the backing plate and mounting the heat the heat exchanger to the exterior of the avionics housing.

10. The avionics control assembly of claim 9 wherein a portion of the backing plate extends about a portion of the heat exchanger housing.

11. The avionics control assembly of claim 10 wherein the portion of the backing plate lines the aperture.

12. The avionics control assembly of claim 10 wherein the portion of the backing plate extends along a periphery of the heat exchanger housing.

13. The avionics control assembly of claim 1, further comprising a valve configured to control fluid communication between the inlet port and the fluid pathway.

14. The avionics control assembly of claim 1, further comprising a bypass heat exchange fluid pathway that connects the inlet port of the heat exchanger to the outlet port, bypassing the heat exchanger and a bypass valve configured to control fluid communication between the inlet port and the heat exchange fluid pathway.

15. The avionics control assembly of claim 1, further comprising a heat exchange fluid in the heat exchanger.

16. The avionics control assembly of claim 15 wherein the heat exchange fluid includes oil.

17. The avionics control assembly of claim 1 wherein the engine control device is a full authority digital engine control device or a pressure subsystem engine control device.

18. A method of controlling temperature in an electronics device having an avionics housing, the method comprising:
flowing heat exchange fluid from a portion of a turbine engine to a heat exchanger that is operably coupled to an electronics device located within a nacelle of a turbine engine where the heat exchanger includes a heat exchanger housing defining a fluid pathway including at least one fluid passageway leading from an inlet port of the heat exchanger to an outlet port of the heat exchanger, the heat exchanger housing have a first side and a second side, opposite the first side where the heat exchanger housing includes at least one aperture extending through the heat exchanger housing from the first side to the second side and where the aperture is fluidly separate from the fluid pathway, where the heat exchanger is operably coupled to the exterior of the avionics housing with at least one connector of the electronics device located within the aperture; and
conveying heat from the flowing heat exchange fluid to an interior of the electronics device via at least one of convection or conduction to at least one of increase a temperature of the electronics device, thaw frozen ice in the electronics device, prevent freezing of water in the electronics device, or evaporate water in the electronics device.

19. The method of claim 18 wherein the heat exchange fluid is engine oil.

20. The method of claim 18 wherein the flowing heat exchange fluid further comprises controlling a bypass of the heat exchange fluid through a bypass fluid pathway.

* * * * *